United States Patent [19]

Krumme et al.

[11] Patent Number: 4,795,870

[45] Date of Patent: Jan. 3, 1989

[54] CONDUCTIVE MEMBER HAVING INTEGRATED SELF-REGULATING HEATERS

[75] Inventors: John F. Krumme, Woodside; Mark J. Cowell, San Carlos, both of Calif.

[73] Assignee: Metcal, Inc., Menlo Park, Calif.

[21] Appl. No.: 745,936

[22] Filed: Jun. 18, 1985

[51] Int. Cl.[4] ............................................. H05B 6/44
[52] U.S. Cl. ................................... 219/9.5; 219/10.43; 219/10.71; 219/10.79; 219/85 A
[58] Field of Search ............. 219/10.43, 10.41, 9.5, 219/10.49 R, 10.71, 10.67, 10.79, 10.75, 85 A, 85 R; 228/180.1

[56] References Cited

U.S. PATENT DOCUMENTS

| | | | |
|---|---|---|---|
| 2,926,231 | 2/1960 | McDowell | 219/9.5 |
| 3,218,384 | 11/1965 | Shaw . | |
| 4,001,490 | 1/1977 | Lynch | 174/88 R |
| 4,091,813 | 5/1978 | Shaw et al. . | |
| 4,185,632 | 1/1980 | Shaw . | |
| 4,256,945 | 3/1981 | Carter et al. | 219/10.75 |
| 4,258,241 | 3/1981 | Soworowski | 219/10.71 |
| 4,292,489 | 9/1981 | Gerber | 219/10.71 |
| 4,315,124 | 2/1982 | Granstrom et al. | 219/10.71 |
| 4,323,748 | 4/1982 | Likins | 219/10.71 |
| 4,327,265 | 4/1982 | Edinger et al. | 219/9.5 X |
| 4,431,891 | 2/1984 | Forstner et al. | 219/9.5 |

FOREIGN PATENT DOCUMENTS 1076772 7/1967 United Kingdom .
WO84/02098 6/1984 World Int. Prop. O. .

OTHER PUBLICATIONS

"New Method of Preventing Ice Formation on Exposed Power Conductors", Toms et al, Proc., IEE, vol. 112, No. 11, Nov. 1965, p. 2,125.

Primary Examiner—Philip H. Leung
Attorney, Agent, or Firm—Hall, Myers & Rose

[57] ABSTRACT

A self-heating and self-soldering bus bar for use in many applications. The pins of the bus bar are quickly and directly heated to a predetermined autoregulated temperature without significantly raising the temperature of the body of the bus. Thusly a bus bar may be mounted while maintaining thermal balance and mechanical integrity of all work pieces. The present invention avoids the problems normally associated with excess thermal expansion experienced when a bus bar is heated incidental to the heating of its contact points. A majority of this incidental heating is eliminated by direct quick heating of the mounting pins.

21 Claims, 4 Drawing Sheets

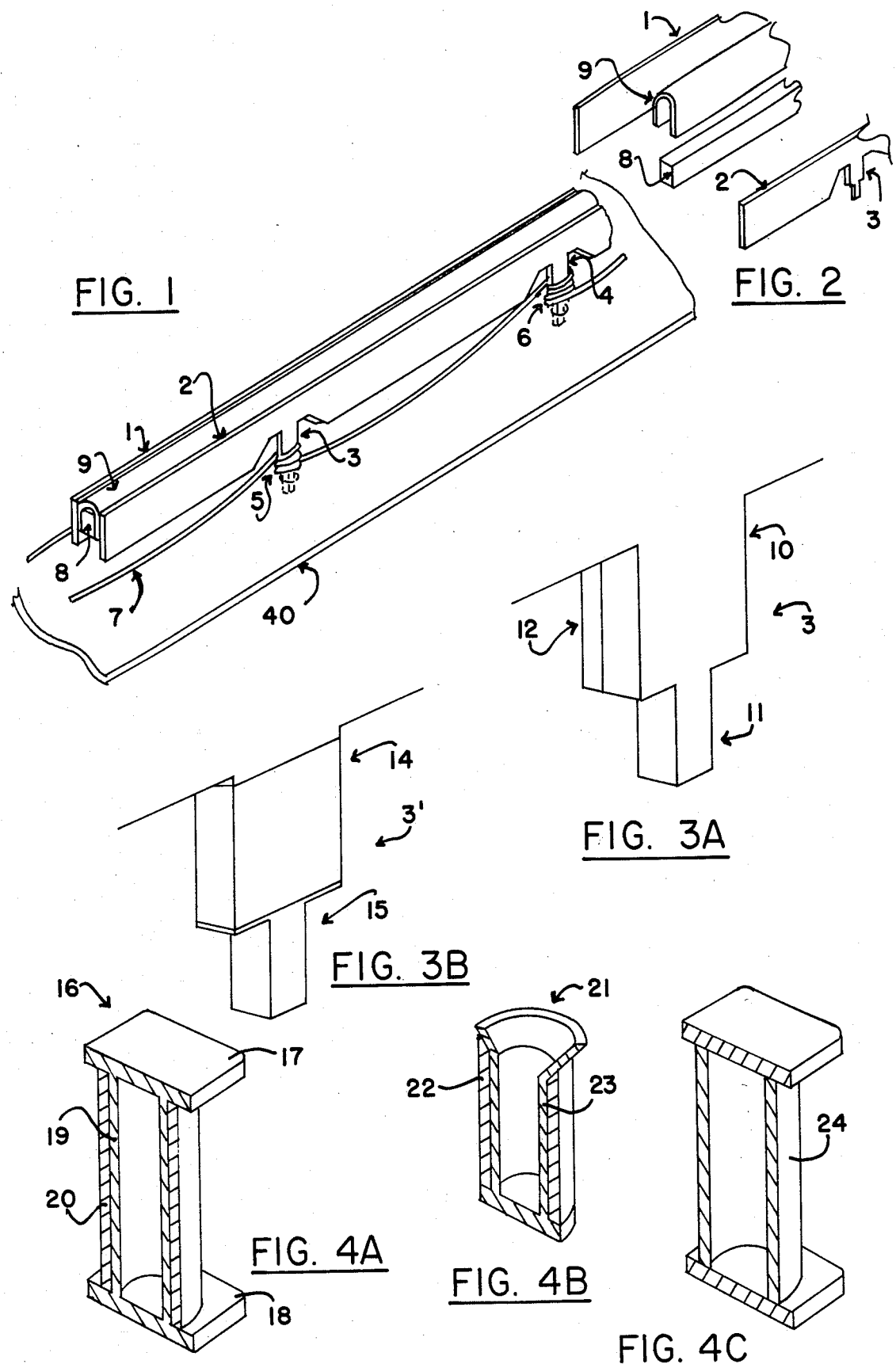

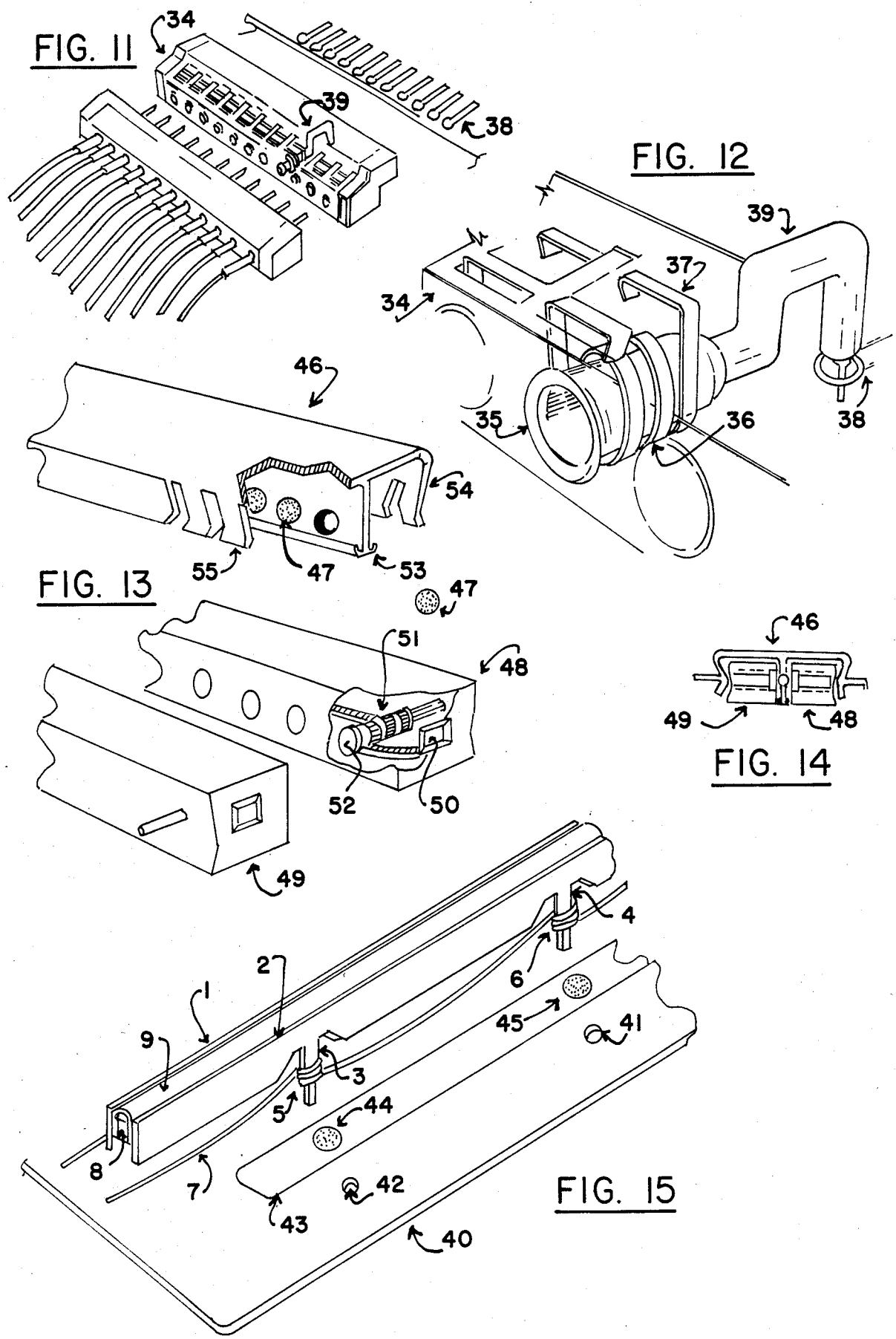

CONDUCTIVE MEMBER HAVING INTEGRATED SELF-REGULATING HEATERS

BACKGROUND OF THE INVENTION

The present invention relates to current carrying bus bars and more particularly to a bus bar capable of self-heating and self-soldering without undergoing thermal expansion.

Several problems exist with present methods available to heat bus bars for soldering to printed circuit boards and other electrical applications. A relatively large Copper bus is desired to carry large amounts of current, resulting in an extremely good electrical and thermal conductor. The heat sink effect which results from this large conductor prevents the bus pins from being uniformly heated.

Present conduction and wave solder techniques are unsatisfactory. Conduction soldering requires a high temperature iron due to the large thermal heat sink of the bus. The temperature gradient which forms across the pins causes improper solder joints especially at the cooler base of the pin. If the bus bar is heated by wave soldering uniform heating is attached across the pins and a good solder joint is formed, however, uniform heating is also attained across the entire length of the bus causing thermal expansion of the bus. When the bus cools and contracts, the board to which it is soldered warps undesirably.

Conventional direct heating which can minimize board warpage also requires that each pin be individually heated which is time consuming and prevents removal of the bus which can only be accomplished by desoldering all pins at once. Also direct conduction heating is applied to the tip of the bus pins and results in non-uniform pin heating and often the base of the pins will not achieve solder melt temperature due to the large thermal sink of the bar.

SUMMARY OF THE INVENTION

The present invention eliminates the problems of thermal expansion in thermally conductive bus bars and also eliminates the multiple step soldering of both conductive and non-conductive bus bars.

The present invention bus bar utilizes inductively energized ferromagnetic thermal heaters to achieve rapid uniform heating of bus bar pins without heating the bus. The ferromagnetic thermal heaters are integrated into each pin of the bus bar and are connected in series to a constant current high frequency power source.

When power is applied from the high frequency power source to the heaters the heaters raise the temperature of the pins to solder melt temperature. The solder which has previously been disposed between the pins and the holes into which the pins are to be mounted melts and flows around the pins and holes. The power is switched off, the pins cool and the solder hardens, mounting the bus bar in place.

Rapid heating of the pins is necessary to allow the pins to achieve solder melt temperature before the main portion of the bus bar heats significantly. To allow rapid heating of the pins the inductive heaters must be extremely light weight, and to prevent overheating, ferromagnetic materials known for their thermal/resistive interdependent properties, are used to comprise the pins of the bus bar. Ferromagnetic materials have a high electrical resistivity when cool but change their resistivity at or about a particular temperature known as the Curie temperature.

When a current passes through a ferromagnetic material the high resistance of the ferromagnetic material causes the generation of resistive heat. When the resistance of the ferromagnetic material drops at the Curie temperature, the amount of heat generated diminishes for a given power input. This tends to prevent further heating once the Curie temperature of the material has been reached.

BRIEF DESCRIPTION OF THE DRAWINGS

For a further understanding of the nature and objects of the present invention, reference should be had to the following detailed description, taken in conjunction with the accompanying drawings in which like parts are given like reference numerals and wherein:

FIG. 1 is an isometric view of one end of the preferred embodiment of the present invention shown mounted through holes in a printed circuit board.

FIG. 2 is an assembly view of an end of the bus bar shown in FIG. 1.

FIGS. 3A and B are detail views of one prong of the bus of FIGS. 1 and 2.

FIGS. 4A-C illustrate three different embodiments of the heating elements contemplated by the present invention.

FIG. 11 is a further illustrative example of the non-conductive embodiment of the present invention.

FIG. 12 is a detail of one of the heaters of the bus of FIG. 11.

FIG. 13 is an assembly view of two busses being joined by a solder preform carrier of the present invention.

FIG. 14 is an end view of the two busses of FIG. 13 after joining.

FIG. 15 is an assembly view of the bus of FIG. 1 being mounted on a board by utilizing a solder preform carrier of the present invention.

DETAILED DESCRIPTION OF THE PREFERRED EMBODIMENTS

Figure 5:
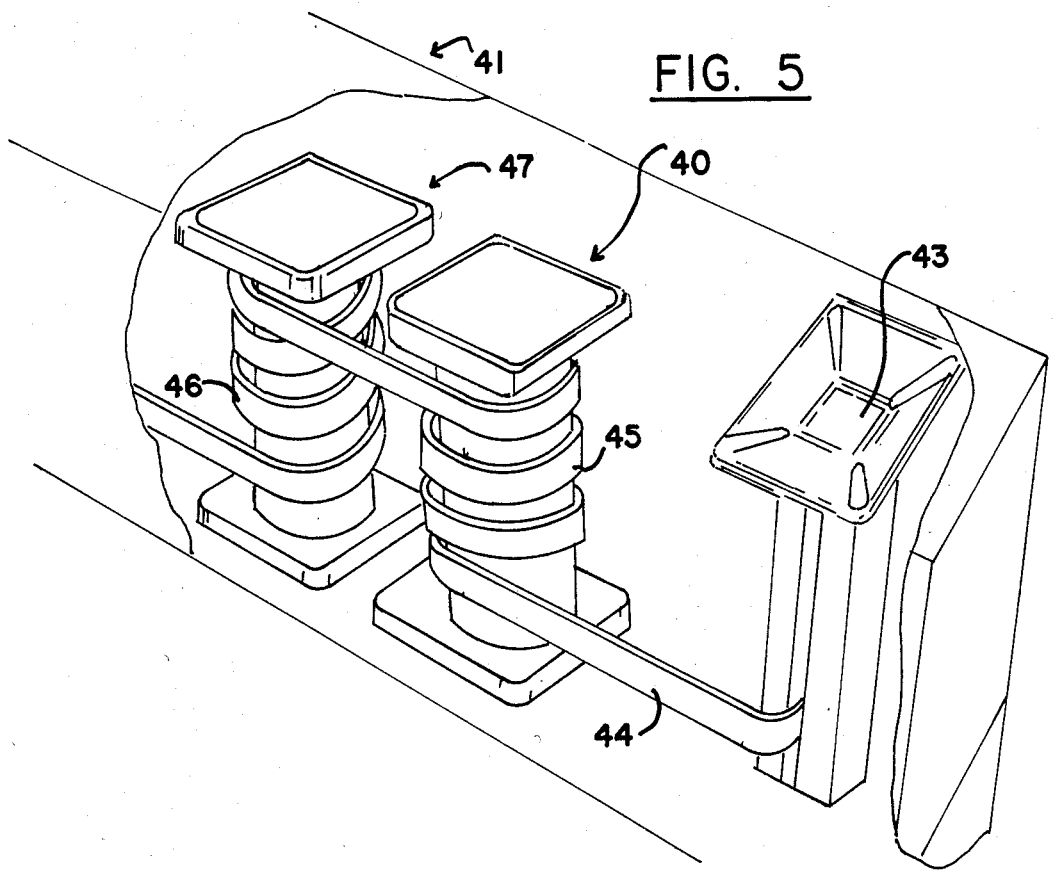
FIG. 5 is a detail cutaway of one end of the non-conductive-frame embodiment of the present invention.

One embodiment of the present invention is shown in FIG. 1 where the first body member 1 and second body member 2 of the bus bar are made of copper or other highly electrically conductive material as any standard current carrying bus would be. The pins 3 and 4 are comprised at least partially of a ferromagnetic material. Insulated wire 7 is wrapped around pins 3 and 4 to form coils 5 and 6. Stiffener 8 is held between body members 1 and 2 and insulated therefrom by insulator 9 as can be seen in FIG. 2.

A high frequency alternating current is passed through coils 5 and 6 in series. The current in these coils 5 and 6 induces a flow of current in the ferromagnetic portion of the pins 3 and 4. The ferromagnetic portion may be a layer 12 as shown in FIG. 3A or the entire pin 3' may be comprised of ferromagnetic material at its base 14 and/or tip 15 as shown in FIG. 3B.

The current which is induced in the ferromagnetic layer generates heat as a function of the resistance of the ferromagnetic layer and the power supplied to the coil. Ferromagnetic materials such as carbon steel are characterized by their high resistance to current flow at low temperatures. This high resistance combined with the low mass of a thin ferromagnetic layer 12 or pin base 14 enables rapid heating of the pins 3 or 3'. Ferromagnetic materials are also characterized by a sudden drop in resistance about a temperature known as a material's Curie temperature. Therefor, once the pin 3 has reached the predetermined Curie temperature of the ferromagnetic material incorporated into the pin 3, the pin temperature will no longer rise because the quantity of resistive heating is drastically reduced.

A typical pin tip 15 with cross-sectional dimensions of 0.035 inches by 0.035 inches and a length of 0.125 inches can achieve solder melt temperature before the bus bar reaches 120° C. A typical power density per pin at the base of a pin of 1000 Watts/square inch yields sufficiently quick and concentrated heating to attain this temperature differential. The base of the pin being typically 0.150×0.140 inches on its broader face yields a power of 25 Watts/pin.

The thermal expansion of the bus body members 1 and 2 will depend on the change in temperature and the length of the bus. Assuming an ambient temperature of the bus of 76° F. and a maximum temperature of 256° F. (120° C.) and a length of 4 inches the thermal expansion would be:

$$(180° F.) (0.95 \times 10^{-5}) (4 \text{ in}) = 0.0068 \text{ inches.}$$

The thermal expansion would be at least 8 times as great were the entire bus bar heated to solder melt temperature.

The temperature dependent resistance of the ferromagnetic heaters greatly increases their efficiency. By exhibiting greater resistance on pins which are cooler and therefor need more heat, the power is used to generate more resistive heat where needed. The high power density combined with this self-regulating power distribution allows the pins of the present invention to reach solder melt temperature in less than 10 seconds.

The high frequency power supply should operate in the range of 8 mHz to 20 mHz and should regulate at a constant current about the parameters defined in co-pending application Ser. No. 568,220 of Rodney L. Derbyshire and assigned to the same entity as this application, see page 46 of Derbyshire.

FIGS. 4 A-C illustrate different configurations and compositions for the pins or heating elements of different embodiments of the present invention. FIG. 4A shows a heating element 16 with flat conductive ends 17 and 18 connected by a hollow conductive core 19. The core 19 is surrounded by ferromagnetic layer 20. The inductive coil would be wound around layer 20 when the heating element 16 is incorporated into a bus bar of the present invention.

The element 21 of FIG. 4B is similar in constructions to element 16 in that a ferromagnetic layer 22 surrounds a conductive core 23. However, one end of element 21 is open for interaction in the embodiment of the present invention shown in FIGS. 7 and 8.

The operation of the heater elements of the present invention where a highly conductive core is combined with a layer of ferromagnetic material (see pin 3, element 16 or elements 21) can best be understood by reference to the patent to Carter and Krumme (U.S. Pat. No. 4,256,945). The conductive layer (10, 19 or 23, respectively) assists in the autoregulation of the temperature by providing a path of low resistance for the alternating current once Curie temperature has been reached. As explained in the Carter and Krumme patent, until Curie temperature is reached the current flow is confined mainly to the ferromagnetic material by virtue of the "skin effect". Once Curie is reached, however, the current flows through the highly conductive material as well and therefore resistive heating is effectively cut off.

FIG. 4C illustrates an embodiment of the present invention where the ferromagnetic layer 24 does not surround a conductive layer. Heating element 25 of FIG. 4C is still wrapped by an inductance coil when incorporated into a bus bar of the present invention.

Each of the heating element configurations illustrated in FIGS. 4 A-C operates on the same heating-/autoregulating principles described earlier.

Figure 6:
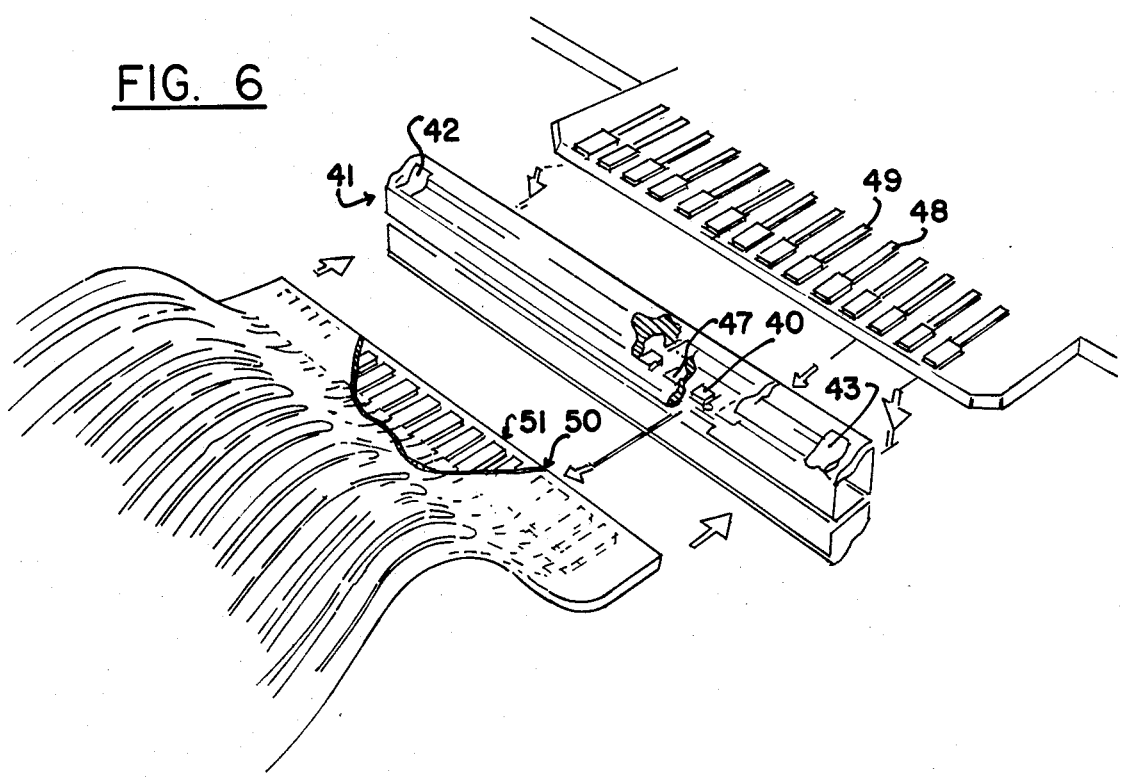
FIG. 6 is one example of the non-conductive bus embodiment of the present invention.

FIGS. 5 and 6 illustrate the arrangement of heaters in a bus bar with a non-conductive frame 41. Current is supplied to the bus bar at contact points 42 and 43. The high frequency alternating current travels along insulated wire 44 to coils 45 and 46. The alternating current in coils 45 and 46 induces current in the ferromagnetic portions of heaters 40 and 47. The induced current heats the heaters 40 and 47 to their Curie temperatures.

Contacts 48 and 49 will contact to one end of heaters 40 and 47, respectively. Contacts 50 and 51 will contact to the opposite ends of heaters 40 and 47, respectively. An amount of solder is disposed between each end of the heaters 40 and 47 and their respective contacts.

The Curie temperatures of the heaters are above the melting point of the solder to be used. The heaters are energized long enough to form a bond between the heaters end faces and the contacts.

Figure 7:
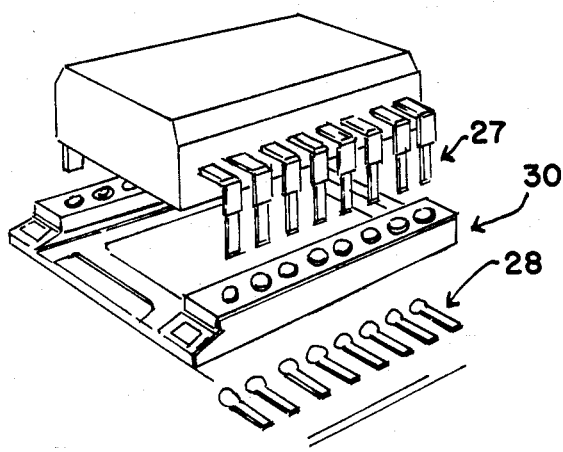
FIG. 7 is a second example of the non-conductive embodiment of the present invention.
Figure 8:
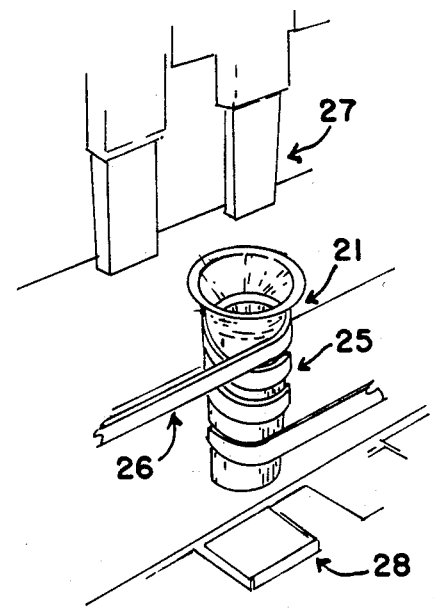
FIG. 8 is a detail of one of the heater elements of the bus of FIG. 7.

FIGS. 7 and 8 illustrate the application of a heater such as shown in FIG. 4B. Where contact is made to the exterior face of one end of the heater 21 by one contact 28 and contact is made to the internal surface of heater 21 by IC pin 27. Bus 30 carries a multiplicity of heaters 21 sufficient to accommodate the IC of the particular application.

Figure 9:
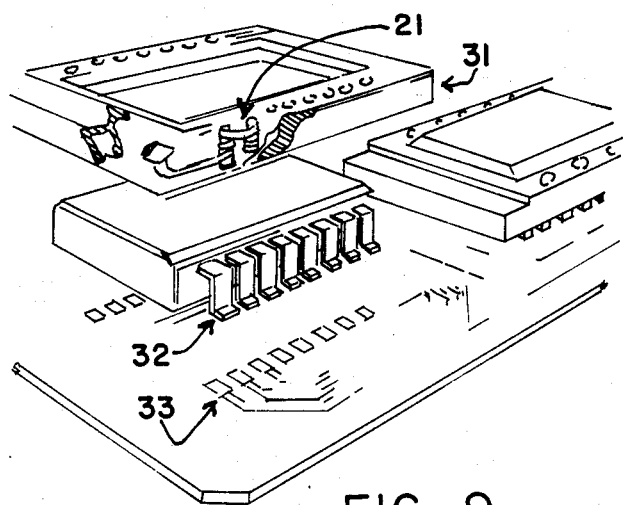
FIG. 9 is another illustrative example of the non-conductive embodiment of the present invention.
Figure 10:
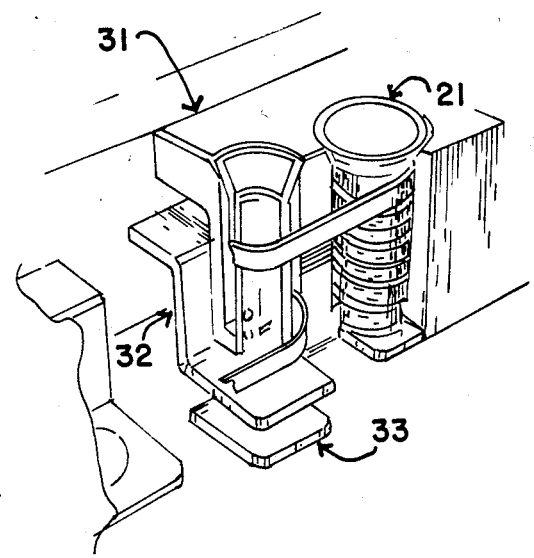
FIG. 10 is a detail of one of the heaters of the bus of FIG. 9.

FIGS. 9 and 10 illustrate an embodiment of the present invention where the bus 31 does not form part of the completed assembly. The bus 31 carries the heaters 21 which make temporary contact to the upper surface of IC pins 32. The solder is disposed between the lower surface of IC pin 32 and surface contact 33. The bus 31 and the heaters 21 which it carries simply supply the heat to the junction of 32 and 33 that is necessary to solder the two together.

Due to the rapid simultaneous heating of all of the pins or heating elements of the bus of the present invention, solder cannot be applied in a conventional manner i.e. to each pin or element one at a time. The present invention therefore requires a solder preform carrier. Two exemplary embodiments are shown as 43 in FIG. 15 and 46 in FIGS. 13 and 14.

Referring to FIGS. 11 and 12, a bus 34 carries a multiplicity of heaters 39, each having an open end 35 to receive pins from a multipin connector. Ribbon coils 36 joined by strip 37 are wound about each heater 39 to energize it. The heater sections terminate in an inverted U-shaped body 39 having a downwardly depending pin to be inserted in an opening in a conductor 38 to which the pin is to be soldered.

FIG. 15 is an assembly view of the bus of FIG. 1 just prior to mounting on printed circuit board 40. The solder carrier 43 is positioned between the bus pins 3 and 4 and the printed circuit board 40 so that solder and flux packets 44 and 45 are directly over holes 42 and 41, respectively. Packets 44 and 45 contain premeasured amounts of solder and flux needed for mount pins 3 and 4 into holes 42 and 41 of the printed circuit board 40.

The carrier 43 may be held in place on board 40 by a self-adhesive backing or by other suitable means. Bus pins 3 and 4 are placed against packets 44 and 45, respectively and a slight force is exerted towards urging pins 3 and 4 into holes 42 and 41.

Power is applied to coils 5 and 6 and pins 3 and 4 heat and melt the solder and flux of packets 44 and 45. Pins 3 and 4 drop into holes 42 and 41 under the urging pressure, and the now molten solder flows into the holes and surrounds the pins. The power is terminated, the pins 3 and 4 cool along with the solder and thusly the bus is mounted to the board 40.

FIG. 13 illustrates a different embodiment of a solder preform carrier 46 to be used with other embodiments of the bus of the present invention. The carrier 46 carries packets of solder and flux 47 at a fixed predetermined position along the carrier center bar 53. The center bar 53 fits between two bus bars 48 and 49. One of the two bars could be a non-heating bus bar and all of the heat would be supplied by the one self-heating bus, or both busses could be self heating.

The solder packets 47 are positioned directly between opposing faces of heater elements such as face 52 and its opposing face (not shown). The busses are urged toward each other by arm 54 and 55. The heaters 51 are energized and the packets 47 melt and flow. Heating is terminated and the solder is allowed to cool while busses 48 and 49 are still being urged toward engagement. The finished assembly, as shown in FIG. 14 includes the carrier 46 as part of the joint.

Because many varying and different embodiments may be made within the scope of the inventive concept herein taught, and because many modifications may be made in the embodiments herein detailed in accordance with the descriptive requirements of the law, it is to be understood that the details herein are to be interpreted as illustrative and not in a limiting means.

We claim:
1. A bus bar comprising:
an elongated conductive frame,
a multiplicity of temperature self regulating heating elements arrayed along an elongated dimension of said frame,
each heating element having a base portion with an insulated current carrier forming a coil thereabout,
means adapted to apply a high frequency alternating current through said coils to energize said heating elements.
2. The bus bar of claim 1, wherein:
each of said heating elements is comprised of a ferromagnetic core with said coil of insulated current carrier wound about said core.
3. The bus bar of claim 2, wherein:
said core of said elements is comprised of a first ferromagnetic layer and a second layer of high electrical and thermal conductivity.
4. The bus bar of claim 3, wherein:
said coils are electrically connected in series.
5. The bus bar of claim 3, wherein:
said elongated frame is comprised of a highly electrically conductive material.
6. The bus bar of claim 3, wherein:
said heating elements are electrically isolated from each other.
7. The bus bar of claim 2, wherein:
said coils are electrically connected in series.
8. The bus bar of claim 2, wherein:
said elongated frame is comprised of a highly electrically conductive material.
9. The bus bar of claim 2, wherein:
said heating elements are electrically isolated from each other.
10. The bus bar of claim 1, wherein:
said elongated frame is comprised of a highly electrically conductive material.
11. The bus bar of claim 1, wherein:
said heating elements are electrically isolated from each other.
12. The bus bar of claim 11, wherein:
said heating elements are hollow with at least one open end.
13. The bus bar according to claim 1 wherein said heating elements are connected in series.
14. A bus bar comprising:
an elongated electrically conductive frame,
a multiplicity of parallel pins extending, from said frame perpendicular to the elongated axis of said frame having a base portion adjacent to said frame and an end portion most distant from said frame,
an insulated current carrier forming a coil about said base of each of said pins,
a high frequency alternating current traveling through said coils, wherein
said pins comprised of a ferromagnetic material, said alternating current in said coils inducing a current in said pins, and wherein said induced current causes a rise in temperature of said pins approach Curie temperature.
15. The bus bar of claim 14, wherein:
said pins are comprised of a first ferromagnetic layer and a second layer of high electrical and thermal conductivity.
16. The bus bar of claim 15 wherein:
said coils are electrically connected in series.
17. The bus bar of claim 14, wherein:
said coils are electrically connected in series.
18. The bus bar of claim 14, wherein:
said pins are shaped for mating engagement with suitably sized orifices,
solder is disposed between said orifices and said pins, and
said pins are soldered into said orifices when said coils are energized by said alternating current.
19. A method of mounting a bus bar comprising the following steps:
forming pins of said bus bar out of a ferromagnetic material,
surrounding a portion of each of said pins with a coil of an insulated current carrier,
electrically connecting said coils in series,
disposing solder between said pins and the mounting holes for each of said pins,
applying pressure to urge said pins into engagement with said mounting holes, energizing said coils with a high frequency alternating electric current,
allowing said pins to reach solder melt temperature along substantially the entire length of said pin,
allowing said solder to melt and flow about said pin and around said mounting hole,
terminating the flow of said current to said coils before the temperature of the main portion of said bus changes substantially, and
allowing said solder to cool and solidify.

20. A method of mounting a bus bar according to claim 19 wherein the step of disposing solder between said pins and the mounting holes includes the step of disposing between a multiplicity of properly spaced predetermined quantities of solder held in fixed relationship by a preform carrier.

21. A temperature self regulating heating member comprising:
a conductive member having an elongated dimension,
at least two protruding regions of said member adapted to be inserted into apertures in a further member,
said regions being comprised at least partially of ferromagnetic material and having a Curie temperature above the melting point of a fusible, conductive material said material being employed to secure said region to a further member, and
independent excitation means adapted to excite said ferromagnetic material of each said region with flux produced by alternating relatively constant current to a temperature approaching said Curie temperature and at least to the melting point of the fusible material to be employed.

* * * * *